(12) United States Patent
Lin et al.

(10) Patent No.: US 7,423,903 B2
(45) Date of Patent: Sep. 9, 2008

(54) SINGLE-GATE NON-VOLATILE MEMORY AND OPERATION METHOD THEREOF

(75) Inventors: Hsin-Chang Lin, Chu-pei (TW);
Wen-Chien Huang, Chu-pei (TW);
Ming-Tsang Yang, Chu-pei (TW);
Hao-Cheng Chang, Chu-pei (TW);
Cheng-Ying Wu, Chu-pei (TW)

(73) Assignee: Yield Microelectronics Corp., Hsin-Chu County (TW)

( * ) Notice: Subject to any disclaimer, the term of this patent is extended or adjusted under 35 U.S.C. 154(b) by 253 days.

(21) Appl. No.: 11/403,858

(22) Filed: Apr. 14, 2006

(65) Prior Publication Data

US 2007/0241383 A1 Oct. 18, 2007

(51) Int. Cl.
*G11C 14/00* (2006.01)
(52) U.S. Cl. .............................. 365/185.08; 365/185.28; 365/185.29; 257/316; 257/318
(58) Field of Classification Search ............ 365/185.08, 365/185.28, 185.29; 257/316, 318
See application file for complete search history.

(56) References Cited

U.S. PATENT DOCUMENTS 6,545,311 B2 * 4/2003 Shukuri et al. ............... 257/314
7,099,192 B2 * 8/2006 Wang et al. ............... 365/185.1

* cited by examiner

*Primary Examiner*—Hoai V Ho
(74) *Attorney, Agent, or Firm*—Rosenberg, Klein & Lee (57) ABSTRACT

A single-gate non-volatile memory and an operation method thereof, wherein a transistor and a capacitor structure are embedded in a semiconductor substrate; the transistor comprises: a first electrically-conductive gate, a first dielectric layer, and multiple ion-doped regions; the capacitor structure comprises: a second electrically-conductive gate, a second dielectric layer, and a second on-doped region; the first electrically-conductive gate and the second electrically-conductive gate are interconnected to form a single floating gate of a memory cell; a reverse bias is used to implement the reading, writing, and erasing operations of the single-floating-gate memory cell; in the operation of a single-gate non-volatile memory with an isolation well, positive and negative voltages are applied to the drain, the gate, and the silicon substrate/the isolation well to create an inversion layer so that the absolute voltage, the area of the voltage booster circuit, and the current consumption can be reduced.

7 Claims, 9 Drawing Sheets

SINGLE-GATE NON-VOLATILE MEMORY AND OPERATION METHOD THEREOF

BACKGROUND OF THE INVENTION

1. Field of the Invention

The present invention relates to a non-volatile memory and an operation method thereof, particularly to a single-gate non-volatile memory and an operation method thereof, wherein the memory can be written or erased with a low voltage and a low current consumption.

2. Description of the Related Art

The COMS (Complementary Metal Oxide Semiconductor) process has been a common fabrication method for ASIC (Application Specific Integrated Circuit). EEPROM is the abbreviation of Electrically Erasable Programmable Read Only Memory. In EEPROM, data not only can be electrically written and erased but also will not volatilize after power has been turned off; therefore, EEPROM has been extensively used in electronic products.

A non-volatile memory is programmable, wherein whether the gate voltage is changed or maintained depends the charging state. In erasing a non-volatile memory, the charges stored thereinside are removed, and the gate voltage is restored to the original values. In the conventional non-volatile memories, the operation voltage is usually over 10 volts; thus, not only the required voltage boostering circuit increases the cost, but also the operation after voltage booster consumes considerable current. Further, when the conventional non-volatile memories, especially embedded products, are fabricated with an advanced process, it usually needs many extra procedures, which increases the difficulties and cost of fabrication. Therefore, all the advanced processes are endeavoring to develop a low-voltage non-volatile memory.

SUMMARY OF THE INVENTION

The primary objective of the present invention is to provide a single-gate non-volatile memory and an operation method thereof to overcome the abovementioned problems, wherein a single-floating-gate structure is used; in programming the memory, a really active voltage is applied to the source, or a back bias is applied to the transistor substrate, in order to create a wider depleted source-substrate junction; thereby, current can flow to the floating gate more efficiently, and the current for programming the single-gate non-volatile memory can be greatly reduced.

Another objective of the present invention is to provide a single-gate non-volatile memory and an operation method thereof, wherein the F-N tunneling current is increased via raising drain voltage and applying a minor voltage to the gate, and the memory is erased with the increased F-N tunneling current; thereby, a high-speed erasion is achieved.

Further another objective of the present invention is to provide a single-gate non-volatile memory and an operation method thereof, wherein positive voltage and negative voltage are jointly used to achieve the efficacies of low operational current, ultra low operation voltage, high reliability, and reducing the size of the whole non-volatile memory.

To achieved the abovementioned objective, the present invention discloses a single-gate non-volatile memory, wherein a transistor and a capacitor structure are embedded in a semiconductor substrate; the transistor comprises: a first dielectric layer, disposed in the semiconductor substrate or inside an isolation well; a first electrically-conductive gate, stacked on the first dielectric layer; and two high-conductivity first ion-doped regions, separately disposed at both sides of the first electrically-conductive gate, and respectively functioning as the source and the drain; similar to the transistor, the capacitor structure has a sandwich-like top layer-dielectric layer-bottom layer structure and comprises: a second dielectric layer, a second electrically-conductive gate, and a second ion-doped region; the first electrically-conductive gate of the transistor and the second electrically-conductive gate of the capacitor structure are electrically interconnected to form a single floating gate of the non-volatile memory; N-type first ion-doped regions and an N-type second ion-doped region are to be used in a P-type semiconductor substrate or a P-type isolation well; and P-type first ion-doped regions and a P-type second ion-doped region are to be used in an N-type semiconductor substrate.

The present invention also discloses an operation method of the abovementioned single-gate non-volatile memory, wherein the memory is programmed via that a voltage is applied to the source, or a back-bias is applied to the substrate of the transistor (or source voltage is greater than substrate voltage in writing the memory); the F-N tunneling current is increased via raising gate voltage (or gate voltage is greater than source voltage in erasing the memory) to achieve a high-speed erasion; a negative-voltage device is used to achieve the efficacies of lower operation current and ultra low operation voltage. Further, any modification and variation according to the structure of the single-gate non-volatile memory disclosed herein and any programming and erasing operation method of the abovementioned single-gate non-volatile memory disclosed herein are to be also included within the scope of the present invention.

To enable the objectives, technical contents, characteristics, and accomplishments of the present invention to be more easily understood, the embodiments of the present invention are to be described in detail in cooperation with the attached drawings below.

DETAILED DESCRIPTION OF THE INVENTION

Figure 1:
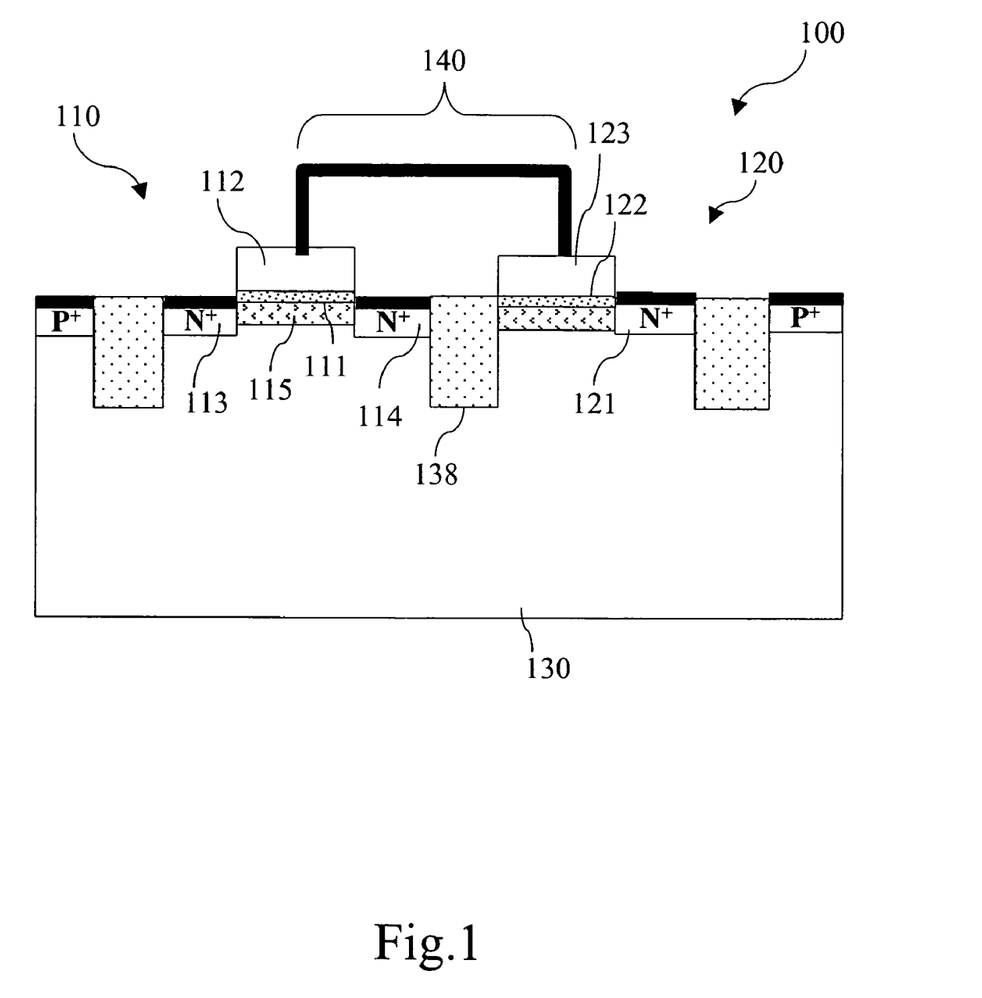
FIG. 1 is a sectional view schematically showing the structure of the single-gate non-volatile memory according to a first embodiment of the present invention.

Refer to FIG. 1 a sectional view schematically showing the structure of the single-gate non-volatile memory according to a first embodiment of the present invention. The single-gate non-volatile memory structure 100 comprises: an NMOS transistor (NMOSFET) 110 and an N-type capacitor structure 120 with both of them embedded in a P-type semiconductor substrate 130. The NMOS transistor 110 further comprises: a first dielectric layer 111, disposed on the surface of the P-type semiconductor substrate 130; a first electrically-conductive gate 112, stacked on the first dielectric layer 111; and two high-conductivity first ion-doped regions, disposed inside the P-type semiconductor substrate 130, and respectively functioning as the source 113 and the drain 114 with a channel 115 formed between the source 113 and the drain 114. The N-type capacitor structure 120 further comprises: a second ion-doped region 121, disposed in the P-type semiconductor substrate 130; a second dielectric layer 122, disposed at the lateral side of the second ion-doped region 121; and a second electrically-conductive gate 123, stacked on the second dielectric layer 122; those abovementioned elements form a top layer-dielectric layer-bottom layer capacitor structure. The first electrically-conductive gate 112 of the NMOS transistor 110 and the second electrically-conductive gate 123 on the top of the N-type capacitor structure 120 are separated with an isolation material 138 and electrically interconnected to form a single floating gate 140. The first ion-doped regions and the second ion-doped region 121 are N-type ion-doped regions.

Figure 2A:
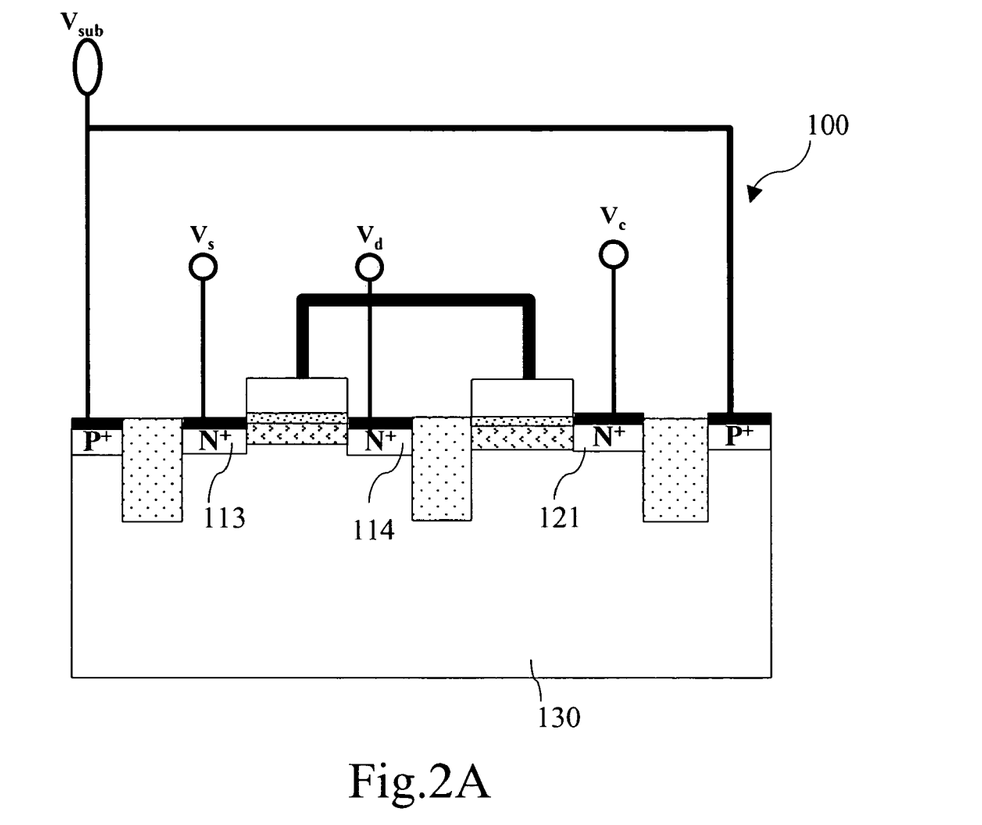
FIG. 2A is a diagram schematically showing the four-terminal structure of the first embodiment.
Figure 2B:
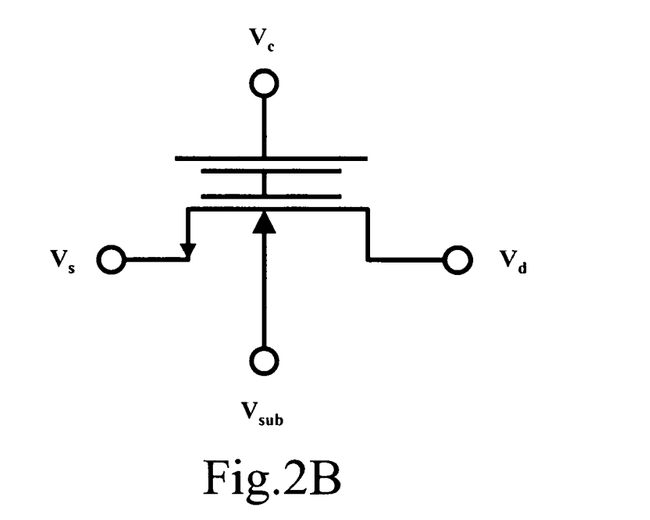
FIG. 2B is a diagram schematically showing an equivalent circuit of the structure shown in FIG. 2A.

Refer to FIG. 2A. The single-gate non-volatile memory structure 100 has four terminals, including: the connecting structures of the substrate, the source, the drain, and the control gate; a substrate voltage $V_{sub}$, a source voltage $V_s$, a drain voltage $V_d$, a control gate voltage $V_c$ are respectively applied to the substrate 130, the source 113, the drain 114, and the second ion-doped region 121. Refer to FIG. 2B for the equivalent circuit thereof. The conditions of the low-voltage operation process of the single-gate non-volatile memory structure 100 are:

In writing the memory:

a. $V_{sub}$ is grounded (=0), and b. $V_d > V_s > 0$, and $V_c > V_s > 0$; and

In erasing the memory:

a. $V_{sub}$ is grounded (=0), and b. $V_d > V_c > V_s \geq 0$.

Figure 3:
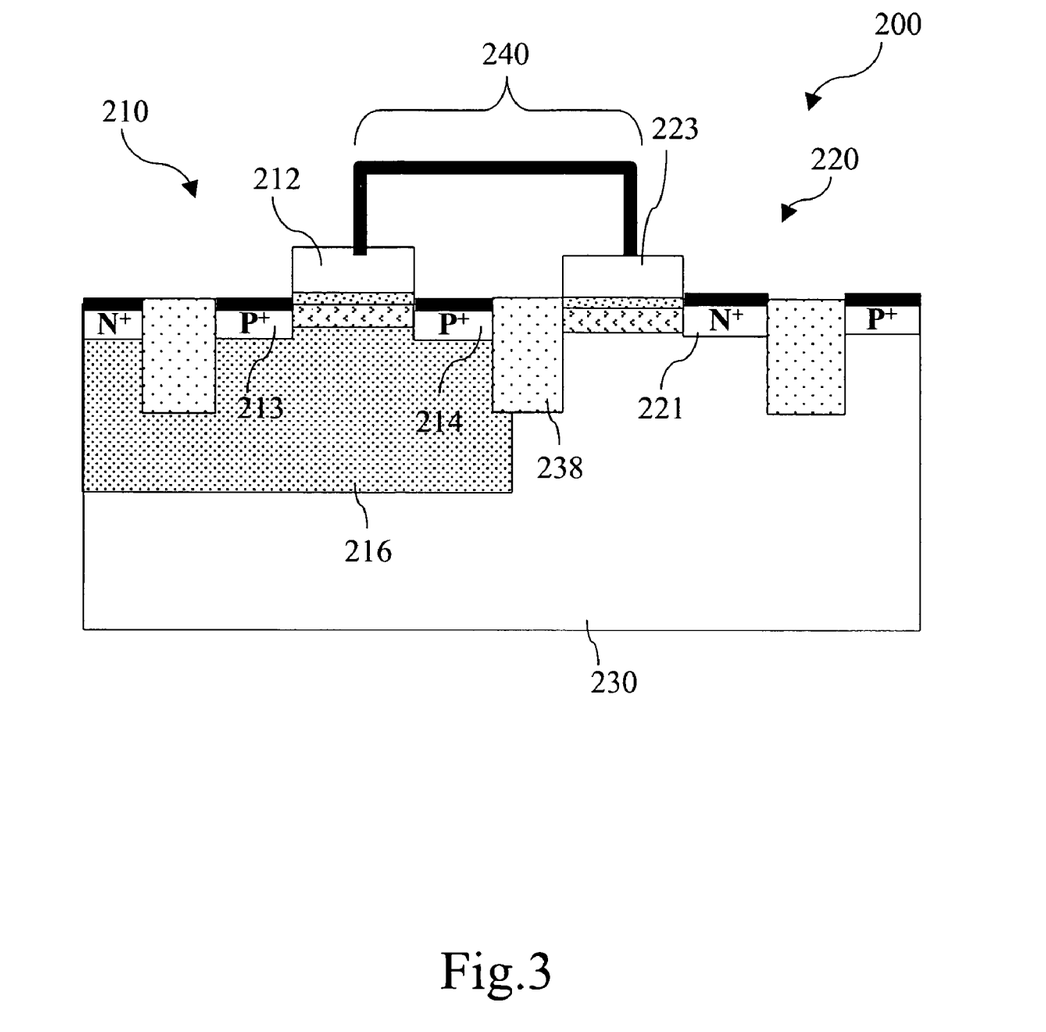
FIG. 3 is a sectional view schematically showing the structure of the single-gate non-volatile memory according to a second embodiment of the present invention.

Refer to FIG. 3 a sectional view schematically showing the structure of the single-gate non-volatile memory according to a second embodiment of the present invention. The single-gate non-volatile memory structure 200 comprises: a PMOS transistor 210 and an N-type capacitor structure 220 with both of them embedded in a P-type semiconductor substrate 230. The first ion-doped regions of the PMOS transistor 210 are P-type ion-doped regions, and the second ion-doped region 221 of the N-type capacitor structure 220 is an N-type ion-doped region. The single-gate non-volatile memory structure 200 further comprises an N-type well 216 disposed below the first ion-doped regions. The first electrically-conductive gate 212 of the PMOS transistor 210 and the second electrically-conductive gate 223 on the top of the N-type capacitor structure 220 are also separated with an isolation material 238 and electrically interconnected to form a single floating gate 240.

When the single-gate non-volatile memory structure 200 is undertaking a low-voltage operation, an N-type well voltage $V_{nwell}$, a source voltage $V_s$, a drain voltage $V_d$, a control gate voltage $V_c$, and a substrate voltage $V_{sub}$ are respectively applied to the N-type well 216, the source 213, the drain 214, the second ion-doped region 221, and the substrate 230, and the relationship between those voltages is:

In writing the memory:

a. $V_{sub}$ is grounded (=0), and b. $V_{nwell} \geq V_s > V_d > 0$, and $V_c > V_d > 0$.

Figure 4:
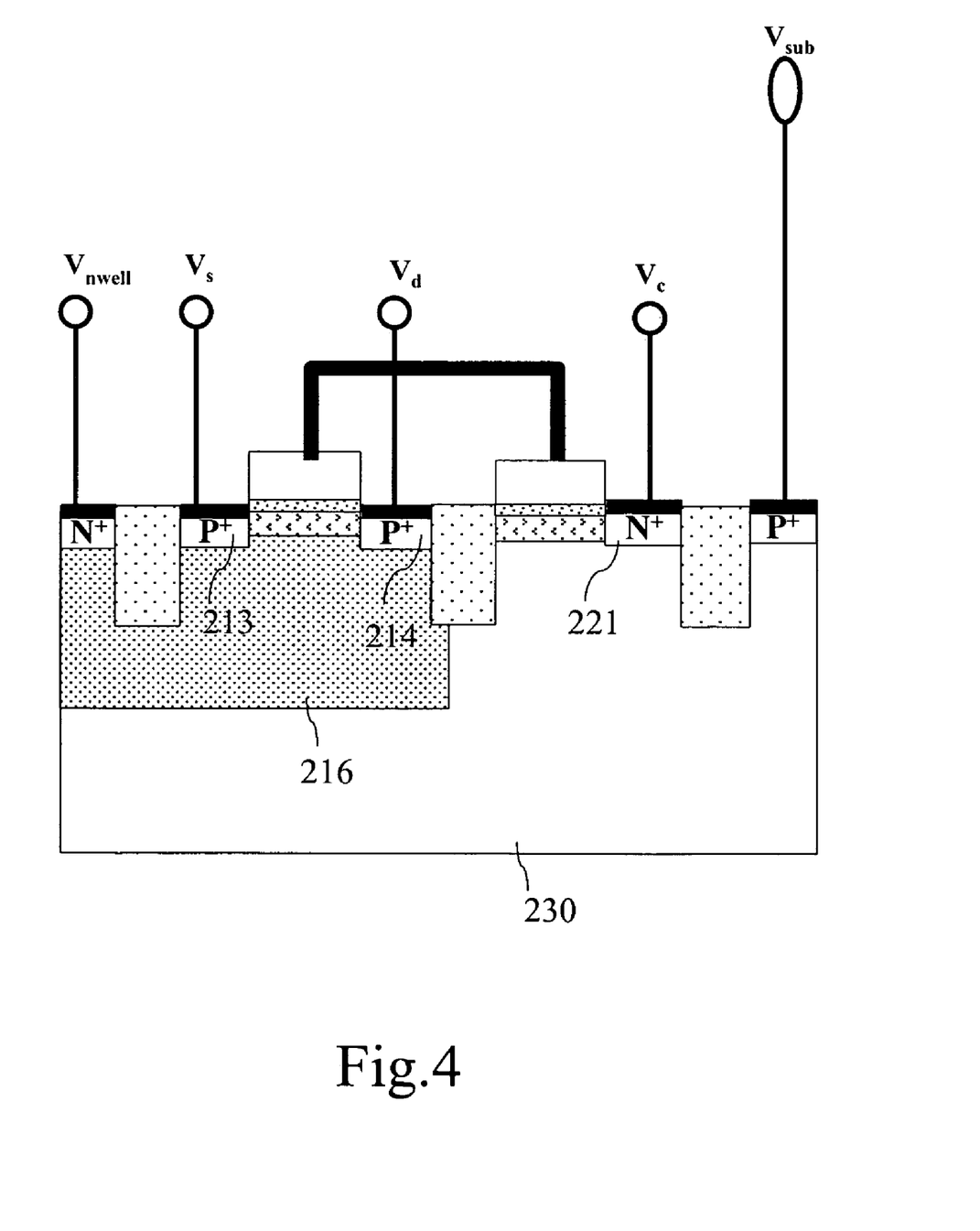
FIG. 4 is a diagram schematically showing the erasing architecture of the second embodiment.

Refer to FIG. 4 a diagram schematically showing the erasing architecture of the single-gate non-volatile memory structure shown in FIG. 3. The N-type well voltage $V_{nwell}$ must be greater than the substrate voltage $V_{sub}$ lest a junction forward bias occur between the N-type well of the PMOS transistor and the P-type semiconductor substrate. The control gate voltage $V_c$ must be great enough lest the PMOS transistor turn on. The source voltage $V_s$ must be increased to be equal to the N-type well voltage $V_{nwell}$, and the drain voltage $V_d$ is equal to the substrate voltage $V_{sub}$ so that the charges of the single floating gate can be erased. The relationship between those voltages is:

In erasing the memory:

a. $V_{sub}$ is grounded (=0), and $V_c > 0$, and b. $V_{nwell} \geq V_s > V_d \geq 0$.

Figure 5:
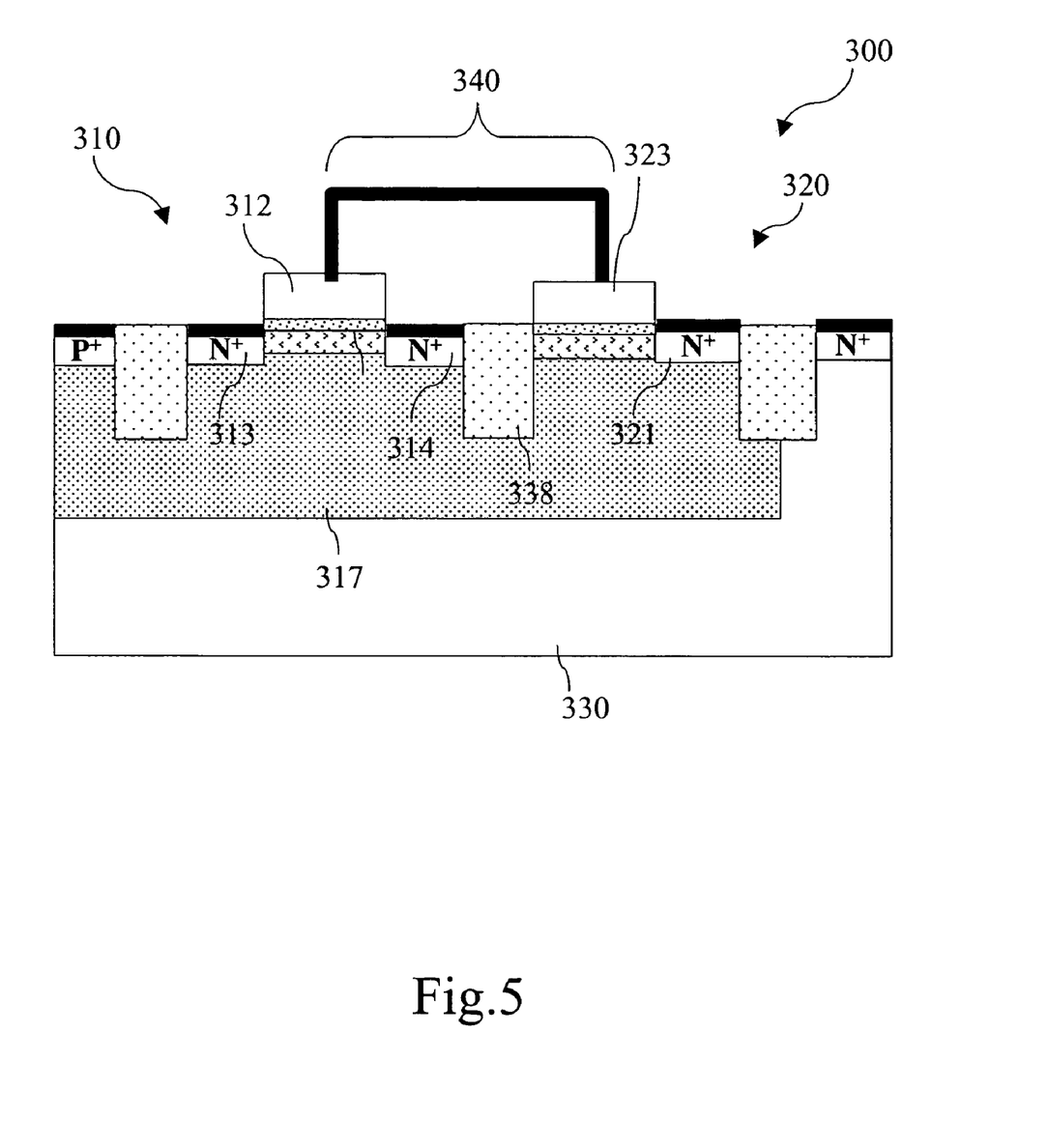
FIG. 5 is a sectional view schematically showing the structure of the single-gate non-volatile memory according to a third embodiment of the present invention.
Figure 6:
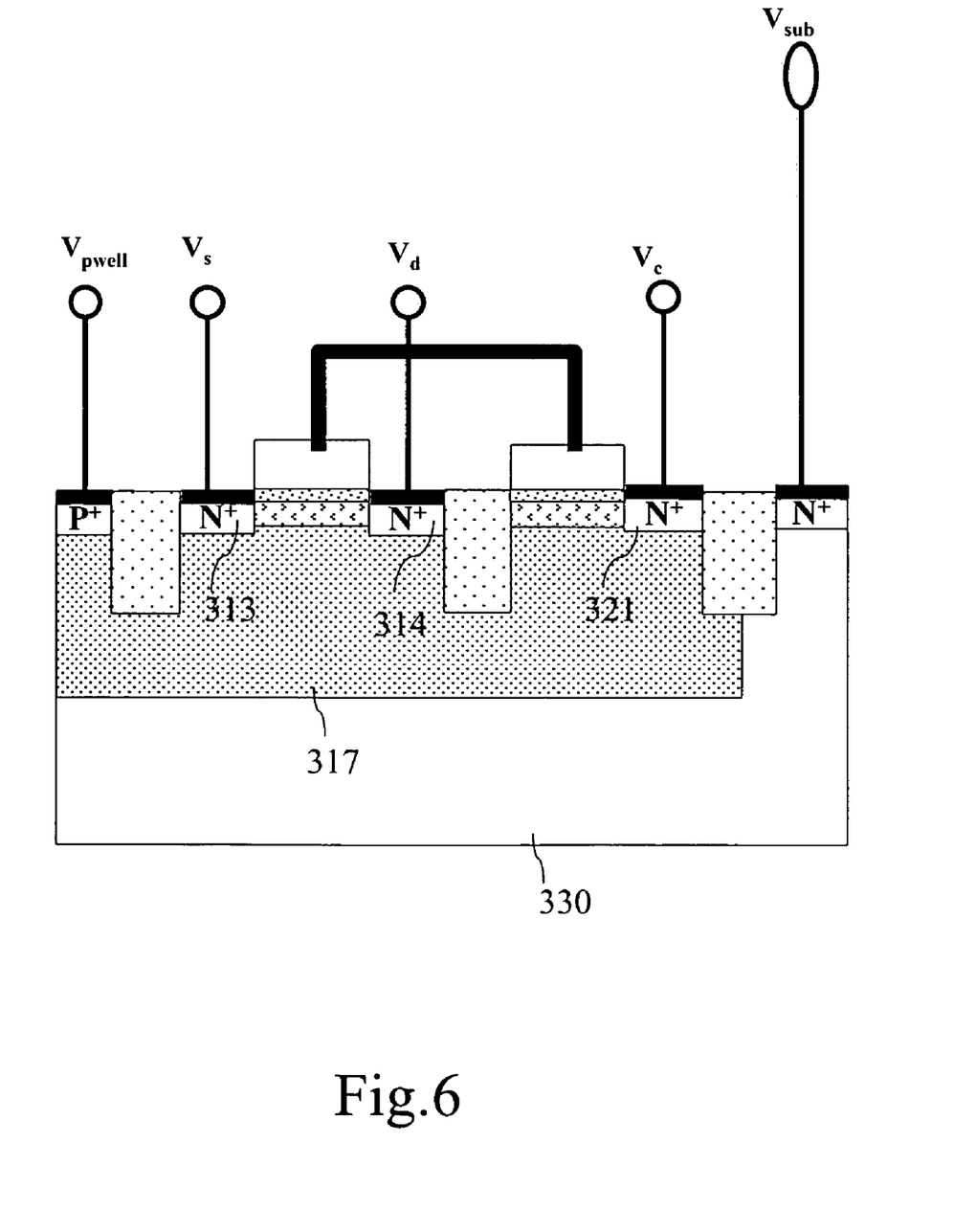
FIG. 6 is a diagram schematically showing the erasing architecture of the third embodiment.

Refer to FIG. 5 a sectional view schematically showing the structure of the single-gate non-volatile memory according to a third embodiment of the present invention. The single-gate non-volatile memory structure 300 comprises: an NMOS transistor 310, an N-type capacitor structure 320, and a P-type well 317 with all of them embedded in an N-type semiconductor substrate 330. The NMOS transistor 310 and the N-type capacitor structure 320 are disposed on the surface of the P-type well 317. The first electrically-conductive gate 312 of the NMOS transistor 310 and the second electrically-conductive gate 323 on the top of the N-type capacitor structure 320 are also separated with an isolation material 338 and electrically interconnected to form a single floating gate 340.

When the writing and erasing processes of the single-gate non-volatile memory structure 300 are undertaken, a P-type well voltage $V_{pwell}$, a source voltage $V_s$, a drain voltage $V_d$, a control gate voltage $V_c$, and a substrate voltage $V_{sub}$ are respectively applied to the P-type well 317, the source 313, the drain 314, the second ion-doped region 321, and the substrate 330, and the conditions of the low-voltage operation process of the single-gate non-volatile memory structure 300 are:

In writing the memory:

a. $V_{sub}$ is connected to a power supply, and $V_{pwell}=0$, and b. $V_d > V_s > 0$, and $V_c > V_s > 0$; and In erasing the memory:

a. $V_{sub}$ is connected to a power supply, and $V_{pwell}=0$, and b. $V_d > V_c > V_s \geq 0$.

The memory may also be programmed via the back bias of the substrate, and the operation conditions of the single-gate non-volatile memory structure 300 are:

In writing the memory:

a. $V_{sub}$ is connected to a power supply, and $V_{pwell}=0$, and b. $V_d > V_s > V_{pwell} 0$, and $V_c > V_s > V_{pwell} 0$; and In erasing the memory:

a. $V_{sub}$ is connected to a power supply, and $V_{pwell}=0$, and b. $V_d > V_c > V_s \geqq 0$.

The single-gate non-volatile memory structure 100 shown in FIG. 1 is formed on a P-type silicon wafer. The isolation structure 138 is fabricated with a standard isolation module process. After the formation of the isolation structure 138, the channel 115 of the NMOS transistor 110 and the N-type capacitor structure 120 are fabricated with ion-implant processes. After the dielectric layers of the first electrically-conductive gate 112 and the second electrically-conductive gate 123 have been grown, a polysilicon layer is formed via a deposition process. The polysilicon layer is patterned with a lithographic process and an etching process to form the single floating gate 140. Next, ion-implant processes are undertaken to form the source 113, the drain 114 of the NMOS transistor 110 and the control gate. Lastly, a metallization process is undertaken, and then, the fabrication of the single-gate non-volatile memory structure 100 is completed.

The fabrication process of single-gate non-volatile memory structure 200 shown in FIG. 3 is essentially similar to that described above; however, different patterning processes are undertaken to pattern the N-type well 216 and the source-gate ion-implant region. The single-gate non-volatile memory structure 300 shown in FIG. 5 is formed on an N-type silicon wafer, and different patterning processes are undertaken to pattern the P-type well 317 and the source-gate ion-implant region. In the present invention, the abovementioned processes usually refer to general CMOS processes.

In the present invention, when the memory is programmed, a voltage is applied to the source of the single-gate non-volatile memory structure. The source voltage will induce a reverse bias in the junction between the source and the substrate. The potential drop between the source and the drain enable the carriers of the channel to move from the source to the drain. The reverse bias between the source and the substrate even expands to the depleted junction region, which can raise the carrier density in the neighborhood of the channel surface. The high carrier density in the neighborhood of the channel surface can promote the current-enhancing effect of the gate and reduce the total current required in programming the memory. Further, the programming speed and reliability can be promoted, and the programming interference can be reduced, thereby. In comparison with the conventional technologies that do not adopt the source-voltage technology, the current-enhancing efficiency of the gate in the present invention is several hundred times higher than that in the conventional technologies.

Further, in the present invention, the F-N tunneling current is increased via raising drain voltage and applying a minor voltage to the gate, and the memory is erased with the increased tunneling current; thereby, a high-speed erasion is achieved.

Figure 7:
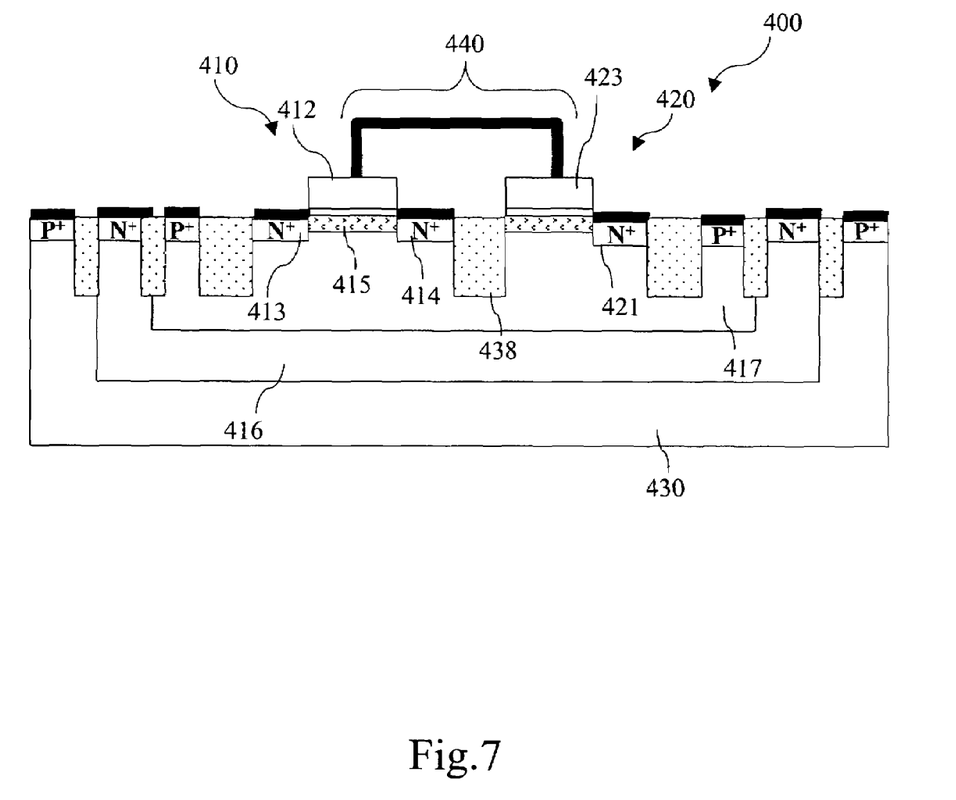
FIG. 7 is a sectional view schematically showing the structure of the single-gate non-volatile memory according to a fourth embodiment of the present invention.
Figure 8A:
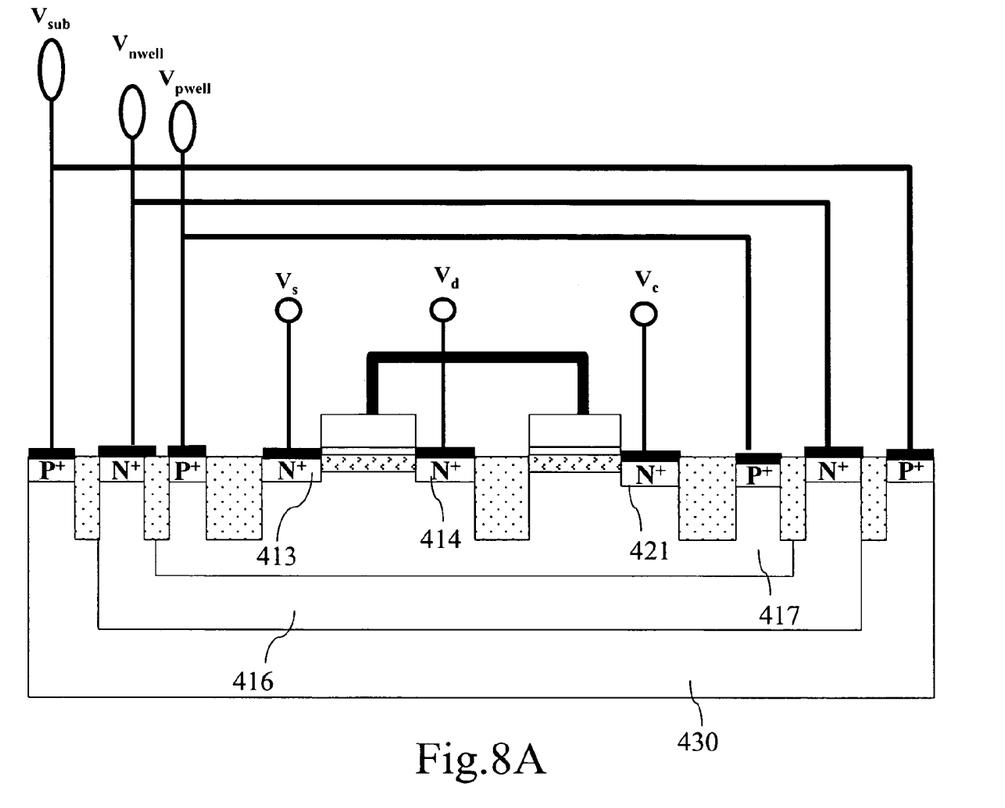
FIG. 8A is a diagram schematically showing the six-terminal structure of the fourth embodiment.
Figure 8B:
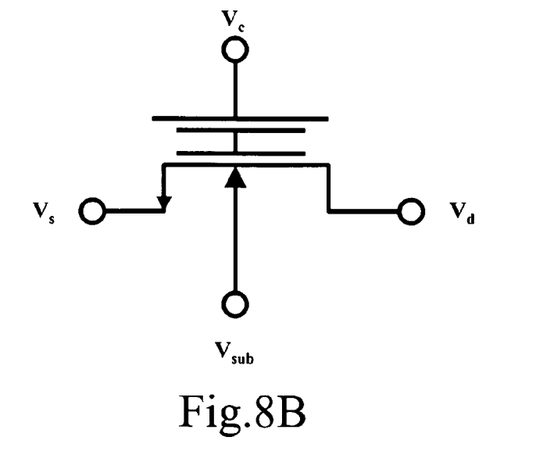
FIG. 8B is a diagram schematically showing an equivalent circuit of the structure shown in FIG. 8A.

Refer to FIG. 7 a sectional view schematically showing the structure of the single-gate non-volatile memory according to a fourth embodiment of the present invention. In the single-gate non-volatile memory structure 400, positive voltage and negative voltage are jointly used to further decrease absolute operational voltage and current. Refer to FIG. 8A. The single-gate non-volatile memory structure 400 is a six-terminal structure and has an isolation well. Those six terminals include: the connecting structures of the substrate, the N-type well, the P-type well, the source, the drain, and the control gate; a substrate voltage $V_{sub}$, an N-type well voltage $V_{nwell}$, a P-type well voltage $V_{pwell}$, a source voltage $V_s$, a drain voltage $V_d$, and a control gate voltage $V_c$ are respectively applied to the substrate 430, the N-type well 416, the P-type well 417, the source 413, the drain 414, and the second ion-doped region 421. Refer to FIG. 8B for the equivalent circuit thereof. The conditions of the low-voltage operation process of the single-gate non-volatile memory structure 400 are:

In writing the memory:

a. $V_{sub}$ is grounded (=0) and $V_{pwell}$ is a negative voltage, and $V_{nwell}$ is a positive voltage, and b. $V_s > V_{pwell}$, and $V_s > V_d$, and $V_c > V_s$; and In erasing the memory:

a. $V_{sub}$ is grounded (=0), and $V_{pwell}$ is a negative voltage, and $V_{nwell}$ is a positive voltage, and b. $V_s \geqq V_{pwell}$, and $V_s > V_d$, and $V_c > V_s$.

The single-gate non-volatile memory structure 400 shown in FIG. 7 is formed on a P-type silicon wafer. The isolation structure 438 is fabricated with a standard isolation module process. After the formation of the isolation structure 438, the N-type well 416, the P-type well 417, and the channel 415 of the NMOS transistor 410 are fabricated with ion-implant processes. After the dielectric layers of the first electrically-conductive gate 412 and the second electrically-conductive gate 423 have been grown, a polysilicon layer is formed via a deposition process. The polysilicon layer is patterned with a photolithographic process and an etching process to form the single floating gate 440. Next, ion-implant processes are undertaken to form the source 413, the drain 414 of the NMOS transistor 410 and the control gate. Lastly, a metallization process is undertaken, and then, the fabrication of the single-gate non-volatile memory structure 400 is completed.

Thus, the operation method of the single-gate non-volatile memory of the present invention can greatly reduce the current consumed in programming the single-gate non-volatile memory. Further, the method of the present invention can also accelerate the speed of erasing the single-gate non-volatile memory via raising the gate voltage to be relatively higher than the drain voltage and the transistor substrate voltage.

Besides, the present invention also provides a fifth embodiment, wherein a negative voltage is applied to the P-type well so that the absolute voltage of the drain or the gate can be decreased (less than 5V) in writing and erasing the memory. Thereby, the present invention can achieve the objectives of low operation voltage and low current consumption in a single-gate non-volatile memory.

Figure 9:
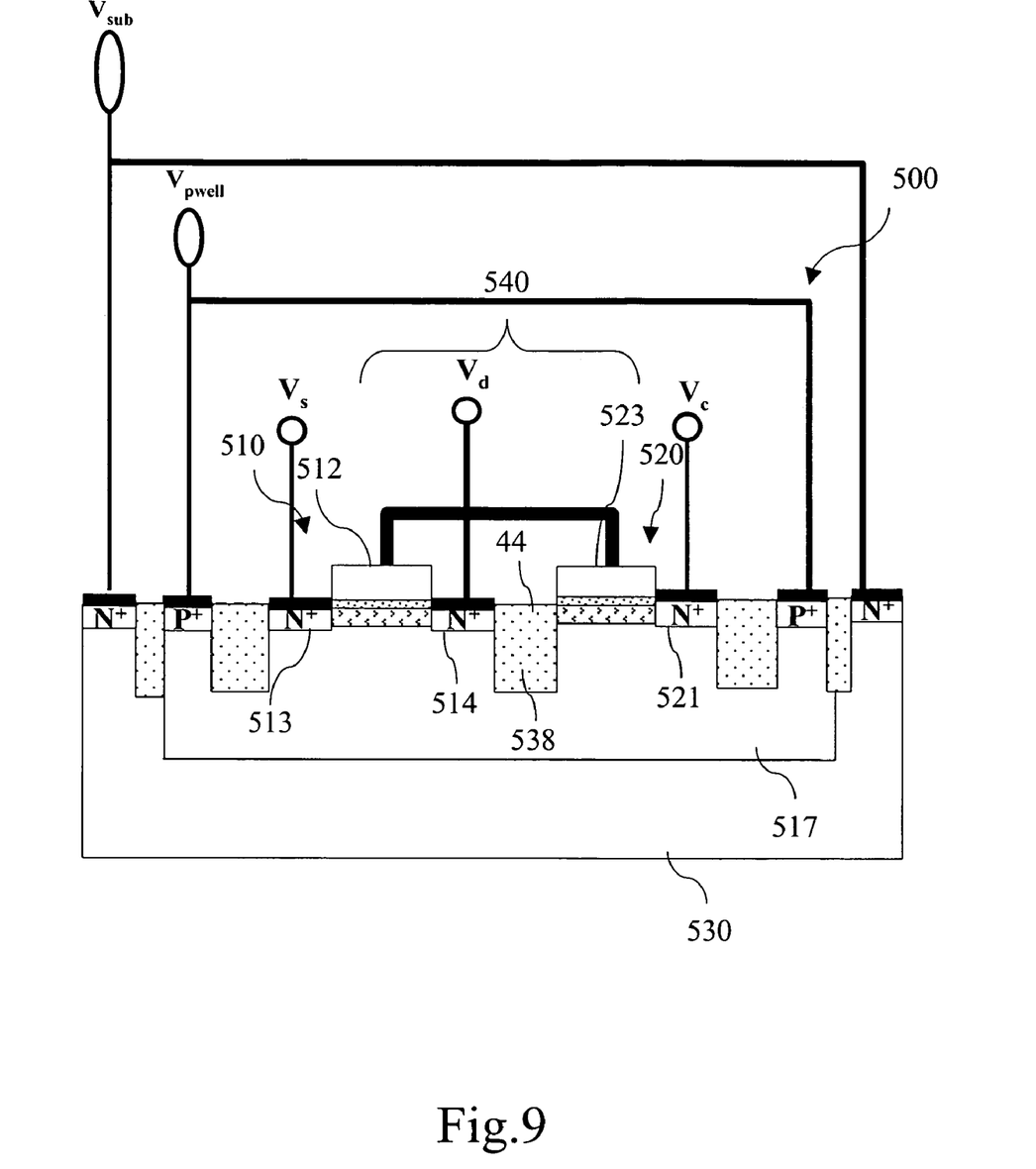
FIG. 9 is a sectional view schematically showing the structure of the single-gate non-volatile memory according to a fifth embodiment of the present invention.

Refer to FIG. 9 a sectional view schematically showing the structure of the single-gate non-volatile memory according to the fifth embodiment of the present invention. The single-gate non-volatile memory structure 500 comprises: an NMOS transistor 510 and an N-type capacitor structure 520 with both of them disposed in a P-type well 517. The P-type well 517 are disposed on an N-type semiconductor 530. The first electrically-conductive gate 512 of the NMOS transistor 510 and the second electrically-conductive gate 523 on the top of the N-type capacitor structure 520 are separated with an isolation material 538 and electrically interconnected to form a single floating gate 540.

When the writing and erasing processes of the single-gate non-volatile memory structure 500 are undertaken, a substrate voltage $V_{sub}$, a P-type well voltage $V_{pwell}$, a source voltage $V_s$, a drain voltage $V_d$, and a control gate voltage $V_c$ are respectively applied to the substrate 530, the P-type well 517, the source 513, the drain 514, and the second ion-doped region 521, and the conditions of the low-voltage operation process of the single-gate non-volatile memory structure 500 are:

In writing the memory:

a. $V_{sub}$ is connected to a power supply, and $V_{pwell}$ is a negative voltage, and b. $V_s > V_{pwell}$, and $V_s < V_d$, and $V_c > V_s$; and In erasing the memory:

a. $V_{sub}$ is connected to a power supply, and $V_{pwell}$ is a negative voltage, and b. $V_s \geq V_{pwell}$, and $V_s < V_d$, and $V_c > V_s$.

Those embodiments described above are to clarify the present invention to enable the persons skilled in the art to understand, make and use the present invention; however, it is not intended to limit the scope of the present invention, and any equivalent modification -and variation according to the spirit of the present is to be also included within the scope of the claims stated below.

What is claimed is:

1. An operation method of a single-gate non-volatile memory,
   wherein said single-gate non-volatile memory comprises:
   a P-type semiconductor substrate;
   a transistor, disposed in said P-type semiconductor substrate, and having a first electrically-conductive gate and a plurality of first ion-doped regions, said first ion-doped regions separately disposed at both sides of said first electrically-conductive gate and respectively functioning as the source and the drain; and
   a capacitor structure, disposed in said P-type semiconductor substrate, and having a second electrically-conductive gate and a second ion-doped region; wherein said first electrically-conductive gate and said second electrically-conductive gate being electrically interconnected to form a single floating gate; wherein said operation method is characterized in:
   a substrate voltage $V_{sub}$, a source voltage $V_s$, a drain voltage $V_d$, a control gate voltage $V_c$ are respectively applied to said P-type semiconductor substrate, said source, said drain and said second ion-doped region, and said voltages meet the following conditions:
   in writing said memory:
   $V_{sub}$ is grounded, and
   $V_d > V_s > 0$, and
   $V_c > V_s > 0$; and
   in erasing said memory:
   $V_{sub}$ is grounded, and
   $V_d > V_c > V_s \geq 0$.

2. An operation method of a single-gate non-volatile memory,
   wherein said single-gate non-volatile memory comprises:
   a P-type semiconductor substrate;
   a transistor, disposed in said P-type semiconductor substrate, and having a first electrically-conductive gate and a plurality of first ion-doped regions, said first ion-doped regions separately disposed at both sides of said first electrically-conductive gate and respectively functioning as the source and the drain;
   an N-type well, disposed below said first ion-doped regions; and
   a capacitor structure, disposed in said P-type semiconductor substrate, and having a second electrically-conductive gate and a second ion-doped region; wherein said first electrically-conductive gate and said second electrically-conductive gate being electrically interconnected to form a single floating gate; wherein said operation method is characterized in:
   a substrate voltage $V_{sub}$, an N-type well voltage $V_{nwell}$, a source voltage $V_s$, a drain voltage $V_d$, and a control gate voltage $V_c$ are respectively applied to said P-type semiconductor substrate, said N-type well, said source, said drain and said second ion-doped region, and said voltages meet the following conditions:
   in writing said memory:
   $V_{sub}$ is grounded, and
   $V_{nwell} \geq V_s > V_d > 0$, and
   $V_c > V_d > 0$; and
   in erasing said memory:
   $V_{sub}$ is grounded, and
   $V_c > 0$, and
   $V_{nwell} \geq V_s > V_d \geq 0$.

3. An operation method of a single-gate non-volatile memory,
   wherein said single-gate non-volatile memory comprises:
   an N-type semiconductor substrate;
   a P-type well, disposed in said N-type semiconductor substrate;
   a transistor, disposed on the surface of said P-type well, and having a first electrically-conductive gate and a plurality of first ion-doped regions, said first ion-doped regions separately disposed at both sides of said first electrically-conductive gate and respectively functioning as the source and the drain; and
   a capacitor structure, disposed on the surface of said P-type well, and having a second electrically-conductive gate and a second ion-doped region; wherein said first electrically-conductive gate and said second electrically-conductive gate being electrically interconnected to form a single floating gate; wherein said operation method is characterized in:
   a substrate voltage $V_{sub}$, a P-type well voltage $V_{pwell}$, a source voltage $V_s$, a drain voltage $V_d$, and a control gate voltage $V_c$, are respectively applied to said N-type semiconductor substrate, said P-type well, said source, said drain and said second ion-doped region, and said voltages meet the following conditions:
   in writing said memory:
   $V_{sub}$ is connected to a power supply, and
   $V_d > V_s > V_{pwell}$, and
   $V_c > V_s > V_{pwell}$; and
   in erasing said memory:
   $V_{sub}$ is connected to a power supply, and
   $V_d > V_s \geq V_{pwell}$, and
   $V_d > V_s \geq V_{pwell}$.

4. The operation method of a memory of claim 3, wherein said P-type well voltage $V_{pwell}$ meet, $V_{pwell} 24\ 0$ in writing said memory.

5. The operation method of a memory of claim 3, wherein said P-type well voltage $V_{pwell}$ meet, $V_{pwell} \geq 0$ in erasing said memory.

6. The operation method of a memory of claim 5, wherein said source voltage $V_s$, said drain voltage $V_d$ and said control gate voltage $V_c$, meet, $V_d > V_c > V_s \geq 0$ in erasing said memory.

7. An operation method of a single-gate non-volatile memory,
   wherein said single-gate non-volatile memory comprises:
   a P-type semiconductor substrate;
   an N-type well, disposed in said P-type semiconductor substrate;
   a P-type well, disposed in said N-type well;

a transistor, disposed on the surface of said P-type well, and having a first electrically-conductive gate and a plurality of first ion-doped regions, said first ion-doped regions separately disposed at both sides of said first electrically-conductive gate and respectively functioning as the source and the drain; and a capacitor structure, disposed on the surface of said P-type well, and having a second electrically-conductive gate and a second ion-doped region; wherein said first electrically-conductive gate and said second electrically-conductive gate being electrically interconnected to form a single floating gate;

wherein said operation method is characterized in:

a substrate voltage $V_{sub}$, a source voltage $V_s$, a drain voltage $V_d$, a P-type well voltage $V_{pwell}$, an N-type well voltage $V_{nwell}$, and a control gate voltage $V_c$ are respectively applied to said P-type semiconductor substrate, said source, said drain, said P-type well, said N-type well and said second ion-doped region, and said voltages meet the following conditions:

in writing said memory:
$V_c > V_s > V_{pwell}$, and
$V_d > V_s > V_{pwell}$, and
$V_{sub}$ is grounded, and
$V_{nwell} \geq 0$; and in erasing said memory:
$V_c > V_s \geq V_{pwell}$, and
$V_d > V_s \geq V_{pwell}$, and
$V_{sub}$ is grounded, and
$V_{nwell} \geq 0$.

* * * * *